(12) United States Patent
Herslow et al.

(10) Patent No.: US 9,390,366 B1
(45) Date of Patent: Jul. 12, 2016

(54) METAL SMART CARD WITH DUAL INTERFACE CAPABILITY

(71) Applicants: John Herslow, Scotch Plains, NJ (US); Adam Lowe, Hillsborough, NJ (US); Luis Dasilva, Bridgewater, NJ (US); Brian Nester, Hillsborough, NJ (US)

(72) Inventors: John Herslow, Scotch Plains, NJ (US); Adam Lowe, Hillsborough, NJ (US); Luis Dasilva, Bridgewater, NJ (US); Brian Nester, Hillsborough, NJ (US)

(73) Assignee: COMPOSECURE, LLC, Somerset, NJ (US)

( * ) Notice: Subject to any disclaimer, the term of this patent is extended or adjusted under 35 U.S.C. 154(b) by 0 days.

(21) Appl. No.: 14/793,963

(22) Filed: Jul. 8, 2015

(51) Int. Cl.
   G06K 19/06 (2006.01)
   G06K 19/077 (2006.01)
   H01L 25/00 (2006.01)

(52) U.S. Cl.
   CPC .... *G06K 19/07769* (2013.01); *G06K 19/07794* (2013.01); *H01L 25/50* (2013.01)

(58) Field of Classification Search
   CPC ............ G06K 19/07769; G06K 19/07794
   USPC .................................. 235/380, 492
   See application file for complete search history.

(56) References Cited

U.S. PATENT DOCUMENTS

| | | | | |
|---|---|---|---|---|
| 7,744,005 | B2* | 6/2010 | Yin | G06K 19/07749 235/380 |
| 8,393,547 | B2* | 3/2013 | Kiekhaefer | G06K 19/02 235/487 |
| 9,251,458 | B2* | 2/2016 | Finn | G06K 19/07769 |
| 2015/0206047 | A1* | 7/2015 | Herslow | G06K 19/07779 235/492 |

\* cited by examiner

*Primary Examiner* — Seung Lee
(74) *Attorney, Agent, or Firm* — Henry I. Schanzer

(57) ABSTRACT

A dual interface smart card having a metal layer includes an IC module, with contacts and RF capability, mounted on a plug, formed of non RF impeding material, between the top and bottom surfaces of the metal layer. The plug provides support for the IC module and a degree of electrical insulation and isolation from the metal layer. The resultant card can have contact and contactless operating capability and an entirely smooth external metal surface except for the contacts of the IC module.

22 Claims, 7 Drawing Sheets

STEP 6

STEP 7

METAL SMART CARD WITH DUAL INTERFACE CAPABILITY

BACKGROUND OF THE INVENTION

The present invention relates generally to "smart" cards and, more particularly, relates to smart cards which have at least one metal layer and are capable of radio frequency transmission (RF) and physical electrical interfacing. In particular, the invention relates to dual interface (i.e., capable of contactless and/or contact operation) smart cards having a metal layer and a rich and aesthetically pleasant appearance.

Smart cards are highly desirable and are in wide use, including: in payment and ticketing applications, such as mass transit and motorway tolls; in personal identification and entitlement schemes on regional, national, and international levels; in citizen cards; in drivers' licenses; in patient card schemes; and in biometric passports to enhance security for international travel.

A smart card is a card that includes embedded electronic circuitry such as an integrated circuit (IC) chip that can be either: (a) a secure microcontroller, also referred to as a microprocessor, or equivalent intelligence device with internal memory; or (b) a memory chip alone. A smart card connects or couples to a card reader with direct physical contact and/or with a remote contactless radio frequency interface.

There are three general categories of smart cards of interest. They are referred to herein as (1) contact, (2) contactless and (3) dual interface. (1) A "contact" smart card includes an IC chip connected to a conductive contact plate on which are mounted a number of physical contact pads (typically gold plated) located generally on the top surface of the card. A contact smart card must be inserted into a contact type smart card reader and transmission of commands, data, and card status takes place over the physical contact pads. (2) A "contactless" smartcard contains an IC chip and a card antenna by means of which RF signals are coupled between the smart card's chip and the antenna of a card reader. This permits wireless (e.g., RF) communication between the card and a card reader with no direct electrical contact between the card and the card reader. A contactless smart card requires only close proximity to a reader. Both the reader and the smart card have antennae, and the two communicate using radio frequencies (RF) over a contactless link. Most contactless cards also derive power for the internal chip from electromagnetic signals emitted by the card reader. The range of operation may vary from less than an inch to several inches. (3) A "dual-interface" smart card has, typically, a single IC chip (but could have two) and includes both contact and contactless interfaces. With dual-interface cards, it is possible to access the IC chip(s) using a contact and/or a contactless interface.

It is desirable to make dual interface smart cards which can provide "contactless" and/or "contact" capability. It has also become very desirable and fashionable to make cards with one or more metal layers. A metal layer provides a desirable weight and a decorative pattern and/or reflective surface enhancing the card's appearance and aesthetic value. This is especially desirable for use by high-end customers. It is therefore desirable to make dual interface (contacts and contactless) smart cards having a metal layer.

However, several problems arise in the making of dual interface ("contactless" and "contact") smart cards with a metal layer because of conflicting requirements. By way of example, to construct a dual interface smart card, the contact pads associated with the IC chip need to be located along an external surface (top or bottom, but normally top) of the card to make contact with a contact card reader and the IC chip will generally be located near the top surface. However, any metal layer in the card interferes with radio-frequency (RF) communication signals (e.g., attenuates) between the card and the reader, and this could render the contactless smart card useless. So, a dual interface smart card with a metal layer needs to solve the problem of RF interference with respect to the IC chip. Compounding the problem is the requirement that the dual interface metal smart card have a highly sophisticated appearance. Due to the prestige and aesthetic aspect of these cards it is desirable that there be no perceptible depression or bump along the surface of the card, except for the contact pads.

SUMMARY OF THE INVENTION

A dual interface smart card embodying the invention includes a top metal layer with a non-metallic plug formed within the metal layer to enable the placement of an IC module about the plug so the card can function as contact and/or contactless card. At the same time the card is made to have a relatively smooth and beautiful external surface.

In general, a hole (opening or cut-out) is formed in the plug for locating an IC chip module about the center area of the plug so the IC module is isolated and insulated from the metal layer. Thus, the plug functions to provide a physical separation and a degree of electrical insulation between the chip module and the metal layer in the horizontal and vertical directions. In addition, the hole in the plug provides a pathway for RF transmission. The chip module includes contacts which extend along the same horizontal surface as the metal layer to enable contact capability with a contact card reader and the chip module extends within the plug's hole to enable contactless (RF) operating capability.

In a particular embodiment the metal layer is a relatively thick layer having a top surface which defines the top surface of the card. A plug is formed in the metal layer below the top surface so the plug is not seen from the top and does not affect the appearance of the card. The lateral dimensions of the plug are greater than the lateral dimensions of the chip module to provide insulation and isolation. A hole is formed vertically down through the plug and an underlying ferrite layer to form a passageway for RF signals to pass between a card booster antenna and an IC module chip antenna. The lateral dimensions of the hole plug are smaller than the lateral dimensions of the IC chip module.

A dual interface smart metal card embodying the invention includes a metal layer in which is disposed an integrated circuit (IC) module to provide contactless (RF) and contact capability. The metal layer has a top surface and a bottom surface extending generally parallel to each other. At least two different sized cut outs are formed in the metal layer, one above the other, both cut outs extending in the horizontal plane, symmetrically about the same center line. One cut out is formed to position and nestle the IC module within the top surface of the metal layer and to enable the IC module, which has contacts to make to a card reader. The IC module and its corresponding one cut out have a depth of approximately D1, a length L1 and a width W1. The other cut out (also called a "pocket"), underlying the one cut out, extends from the bottom surface of the metal layer until a distance D1 from the top surface. The pocket is made to have a length L2 greater than L1 and a width W2 greater than W1 to enable RF transmission between the IC module and a card reader. A non-metallic plug designed to fit snugly within the pocket fills the pocket and is attached to the walls of the pocket. The plug has a centrally located opening having a length L3 which is smaller than L1 and a width W3 which is less than W1.

BRIEF DESCRIPTION OF THE DRAWINGS

The invention will be understood more completely from the following detailed description of presently preferred, but nonetheless illustrative, embodiments in accordance with the present invention, with reference being had to the accompanying drawings, which are not drawn to scale, but in which like reference characters denote like components.

DETAILED DESCRIPTION OF THE PREFERRED EMBODIMENTS

Figure 1:
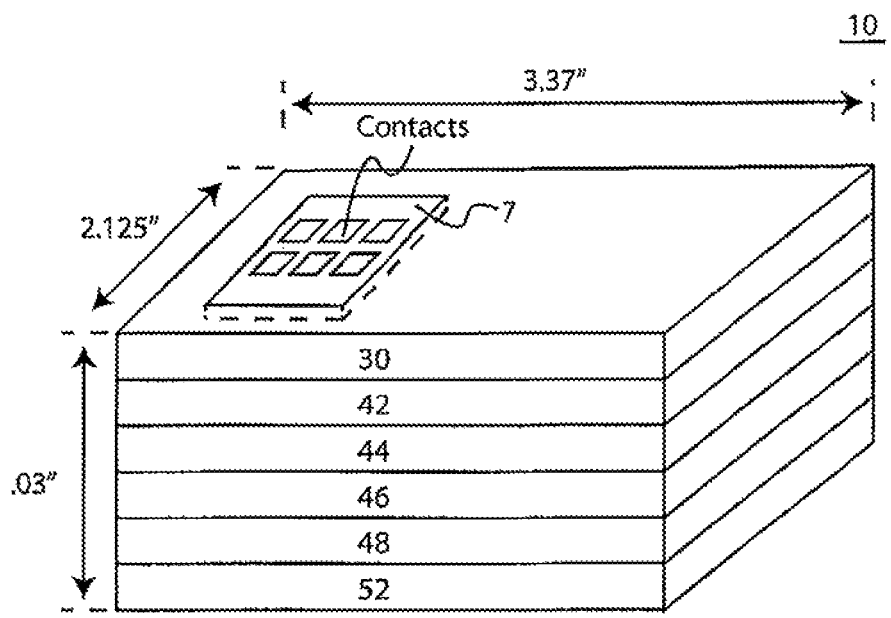
FIG. 1 is a simplified, isometric diagram of a smart card 10 with a metal layer 30, embodying the invention.
Figure 1A:
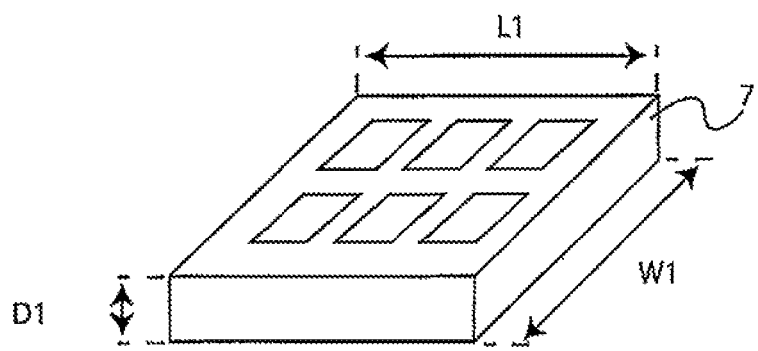
FIG. 1A is a highly simplified, idealized isometric diagram of an integrated circuit (IC) module capable of contactless and contact operation intended for use in making smart cards embodying the invention.

An integrated circuit (IC) module 7 having multiple contacts as shown in FIG. 1A is to be mounted in, and on, a card 10 as shown in FIG. 1 with the top surface of the IC module and its contacts generally flush with the top surface of the card. By way of example it is shown that the length, width and depth of the card may respectively be approximately 3.37 inches by 2.125 inches by 0.03 inches. For purpose of illustration and the discussion to follow assume, as shown in FIG. 1A, that the IC module has a depth D1, a length L1 and a width W1. Modules such as IC module 7 are commercially available, for example, from Infineon or NXP. The lateral dimensions of some of these modules were approximately 0.052 inches by 0.47 inches with a depth ranging from 0.005 inches to more than 0.025 inches. These dimensions are purely illustrative and IC modules used to practice the invention may be greater or smaller in size.

Figure 1B:
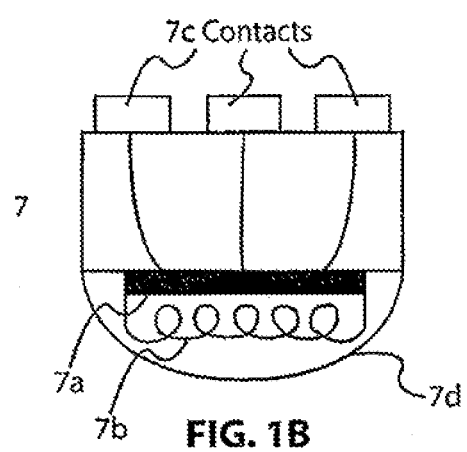
FIG. 1B is a simplified idealized cross sectional diagram of the IC module of FIG. 1A used in the card shown in FIG. 1.

As shown in FIG. 1B, IC module 7 contains an internal microprocessor chip 7a, a chip antenna 7b and a contact pad 7c. Pad 7c may be a conventional multi-contact pad used in contact-type smart cards and is positioned to engage contacts in a contact card reader (not shown) when the smart card is inserted therein. An epoxy blob 7d encapsulates the bottom side of the IC module. The epoxy blob allows the IC module to be easily attached (e.g., by gluing) to an underlying surface.

As noted above, the invention is directed to the manufacture of a smart metal card having dual interface capability and also having a top surface which is free of any bumps or depressions, except for: (a) the IC module and its contacts, and/or (b) any design or texture intentionally formed on the top surface. In accordance with the invention, a card can be made to have a highly aesthetic, smooth and visually pleasing appearance even though the card must include dual interface capability (i.e., contact and contactless capability). That is, smart cards having a metal layer as a top surface, for aesthetic reasons, must include an IC module and its associated contacts. For the card to be used in a contact mode, the contacts of the IC module have to be located along an exterior surface of the card. Typically, the contacts are located along the top surface of the card; although the contacts could conceivably be located along the bottom surface of the card. To enable effective wireless (RF) transmission there has to be a cut out (opening) in the metal layer underlying and surrounding the IC module. A challenge is to produce these cut outs (openings) in the metal layer without affecting the smooth, aesthetic, exterior (e.g., top) appearance of the card.

Figure 2:
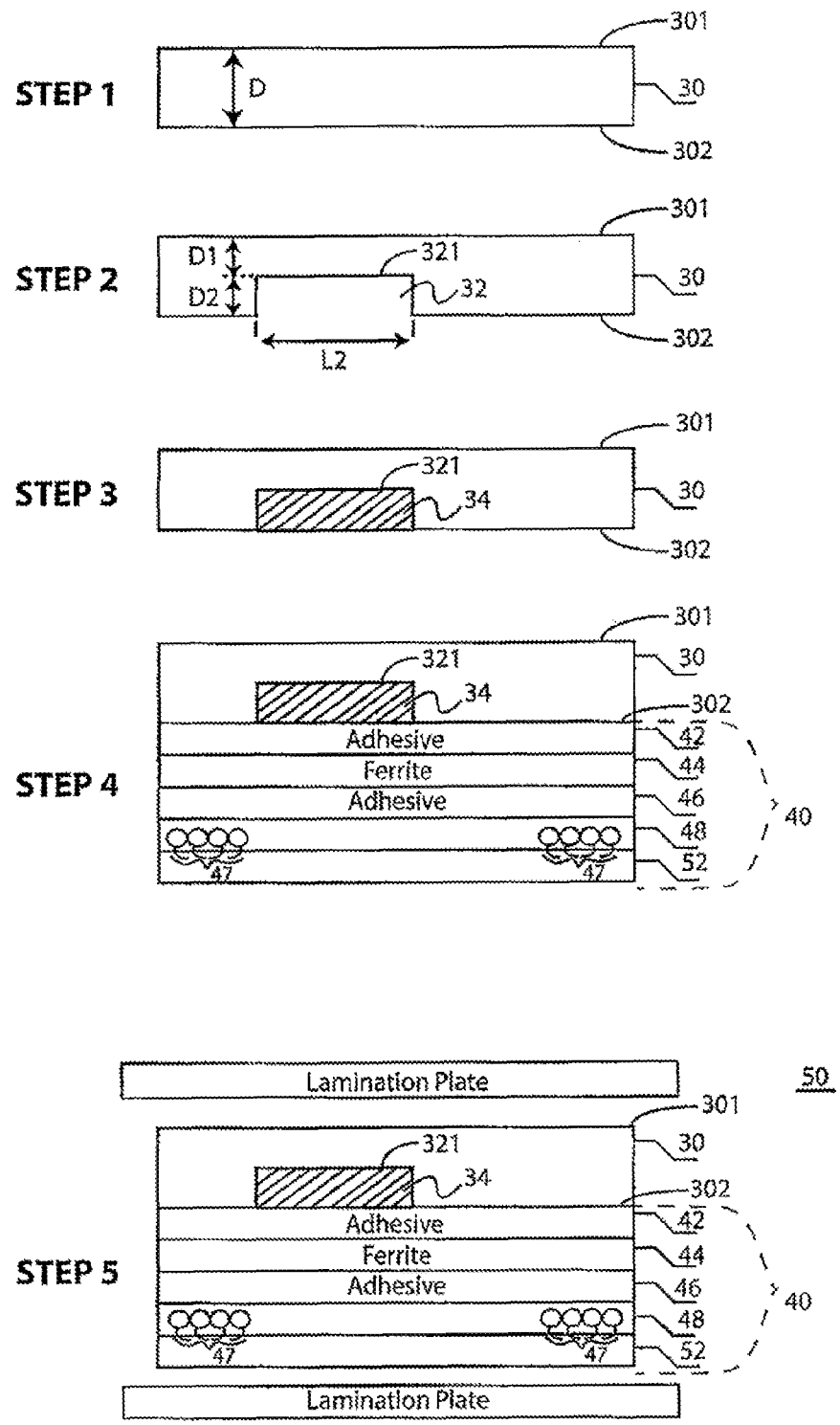
FIG. 2 includes cross sectional diagrams of various processing steps (1 through 7) to form a card embodying the invention.
Figure 2:
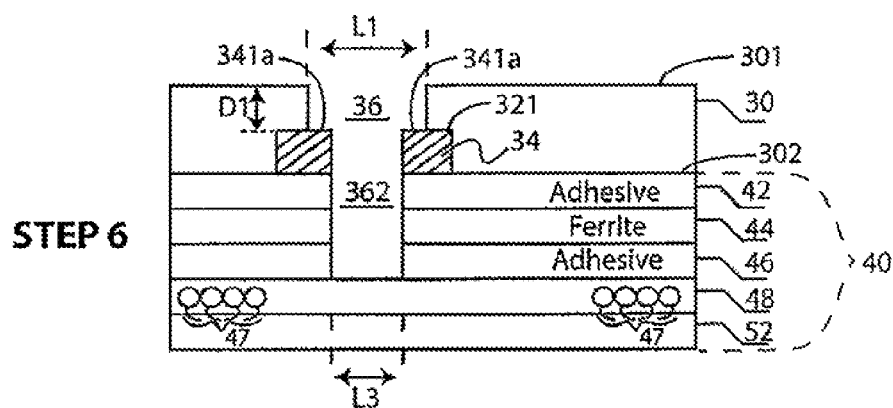
Figure 2:
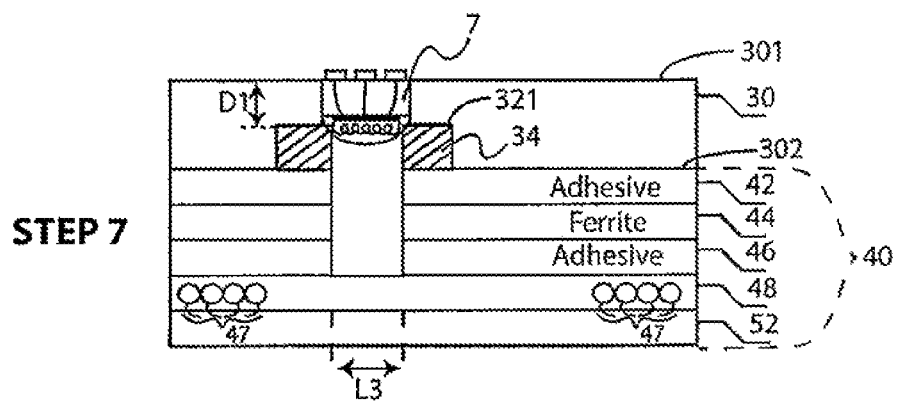

A method of forming a card in accordance with the invention includes the structure and processing steps illustrated in FIG. 2.

1—A metal layer 30 is selected which is intended to serve as the top layer of a card 10 (as shown in step 1 of FIG. 2). The metal layer 30 has a top (front) surface 301 and a bottom (back) surface 302; the front and back surfaces are generally parallel to each other. The thickness (D) of the metal layer 30 may range from less than 0.01 inches to more than 0.02 inches. In one embodiment the metal layer 30 was made of stainless steel and its thickness was 0.0155 inches. Metal layer 30 may, by way of example and not by way of limitation, be selected to be iron, tantalum, aluminum, brass, copper or any alloy or compound thereof.

2—A pocket 32 is formed along the underside of layer 30. It may be referred to as a reverse pocket formed starting from the bottom surface of metal layer 30 (as shown in step 2 of FIG. 2). The pocket 32 may be formed in any known manner including, but no limited to: milling, casting, 3D printing, laser cutting, water jet electro-discharge (EDM). The pocket 32 has a top 321 which ends a distance (or thickness) D1 below top surface 301, where D1 is typically equal to (or nearly equal to) the depth of the IC module 7. The depth (thickness) D2 of pocket 32 is then equal to (D-D1) inches. D2 will generally always be set to equal the depth D of the metal layer 30 minus the thickness D1 of the IC module used to form the card. The pocket 32 may be of regular or irregular shape, a rectangular solid or a cylinder whose planar projection in the horizontal plane may be a square, a rectangle or a circle. The lateral dimensions [length (12) and width (W2)] of the pocket 32 can be, respectively, equal to or greater than the lateral dimensions [length L1 and width W1] of the IC module as further discussed below. In the embodiments L2 and W2 are shown to be, respectively, greater than L1 and W1, but that is not a necessary condition.

3—A plug 34 of any material which does not substantially interfere with RF transmission (e.g., any non-metallic material, or even a material such as tungsten or a composite thereof) is formed or shaped to conform to the dimensions of the milled pocket 32 and is inserted in the pocket to fill the milled (cut out) region (as shown in step 3 of FIG. 2). As discussed below the plug functions to electrically isolate and insulate the IC module from the metal layer and to also physically secure the IC module. The interior of the pocket 32 and/or the exterior of the plug 34 is/are coated with a suitable adhesive (e.g., such as acrylic or acrylic modified polyethylene, cyanoacrylate, silicone elastomer, epoxy) so the plug 34 adheres firmly to the walls of the pocket throughout the processing of the metal layer in the formation of the card. The plug 34 may be made of any thermoplastic material such as PET, PVC or other polymer or any material such as curable resin or epoxy or a ceramic or even of tungsten material which does not significantly impede radio frequency (RF) transmission.

4—As shown in step 4 of FIG. 2, an adhesive layer 42 is used to attach a ferrite layer 44 to the back surface 302 of layer 30. The ferrite layer 44 is placed below the metal layer 30 to act as a shield (reflector) to prevent/reduce metal layer 30 from interfering with radio frequency radiation to and from the smart card. Ferrite layer 44 decreases the "shorting" effect of metal layer 30 for enabling transmission or reception via antenna 47. Those skilled in the art will appreciate that it would also be possible to form or lay out the ferrite material in a different manner.

Also, an adhesive layer 46 is used to attach a plastic (e.g., PVC) layer 48 which contains and/or on which is mounted a booster antenna 47. Layer 48 may be made of PVC or polyester and may be between 0.001 and 0.015 inches thick. The windings of booster antenna 47 may range from less than 80 microns to more than 120 microns in diameter and may be secured to layer 48 by ultrasonic welding or heating the wire prior to placing it in contact with the plastic layer or by any other suitable process. A layer 52 which includes a signature panel and a magnetic stripe may be attached to layer 48 before or after lamination. Layers 42, 44, 46, 48 (and possibly 52) may be formed as a sub-assembly 40 and attached to the bottom side 302 of metal layer 30.

5—The assembly comprising layers 30, 42, 44, 46 and 48 is laminated (as indicated in step 5 of FIG. 2) to form a card assembly 50.

6—A hole (or opening) 36 is then formed (e.g., by milling) through the metal 30 to a depth D1 from the top surface and, concurrently, a hole 362 is then formed in plug 34, (e.g., by drilling about the center of the plug 34) and through the underlying layers 42, 44 and 46 until layer 48, as shown in step 6 of FIG. 2. The lateral dimensions of hole 36 formed in the metal layer 30 are designed to correspond to the dimensions L1 and W1 of the IC module 7 so the IC module can be inserted in the hole (opening) 36. The lateral dimensions of the hole 362 formed in the plug 34 will be L3 and W3, where L3 and W3 are less than L1 and W1. So made, plug ledges 341a will provide support for the IC module and keep it at its designed height of D1 below the top card surface. The IC module can be snugly inserted and attached to the sides of opening 36 and to top 341a of the plug 34. That is, the IC module can be inserted with tight clearance and glued in place. The smaller hole (opening) 362 formed below hole 36 accommodates the rear (bottom) end of module 7. Hole 362 extends vertically down through ferrite layer 44 and is made sufficiently wide to enable RF signals to pass between antenna 47 and the chip antenna 7b.

With respect to the operation of the card, booster antenna 47 is designed to capture radio frequency energy generated by an associated card reader (not shown) and to communicate with the card reader. By design, module antenna 7b is sufficiently close to couple inductively with antenna 47, thereby providing signals from antenna 47 to chip 7a, while keeping the chip electrically isolated from antenna 47. In operation, ferrite layer 44 shields metal layer 30, to make it possible for radio frequency radiation to enter and be emitted from card 10. In operation, ferrite layer 44 shields metal layer 30, to make it possible for radio frequency radiation to enter and be emitted from card 10. Booster antenna 47 is designed to capture radio frequency energy generated by an associated card reader (not shown) and to communicate with the card reader. By design, module antenna 7b is sufficiently close to couple inductively with antenna 47, thereby providing signals from antenna 47 to chip 7a, while keeping the chip electrically isolated from antenna 47.

7—As shown in Step 7 of FIG. 2, an IC module 7 which, as shown in FIG. 1B, includes a chip 7a, a chip antenna 7b and a set of contacts 7c is positioned within hole 36. The IC module 7 is glued in place completing the formation of a card embodying the invention.

Figure 3A:
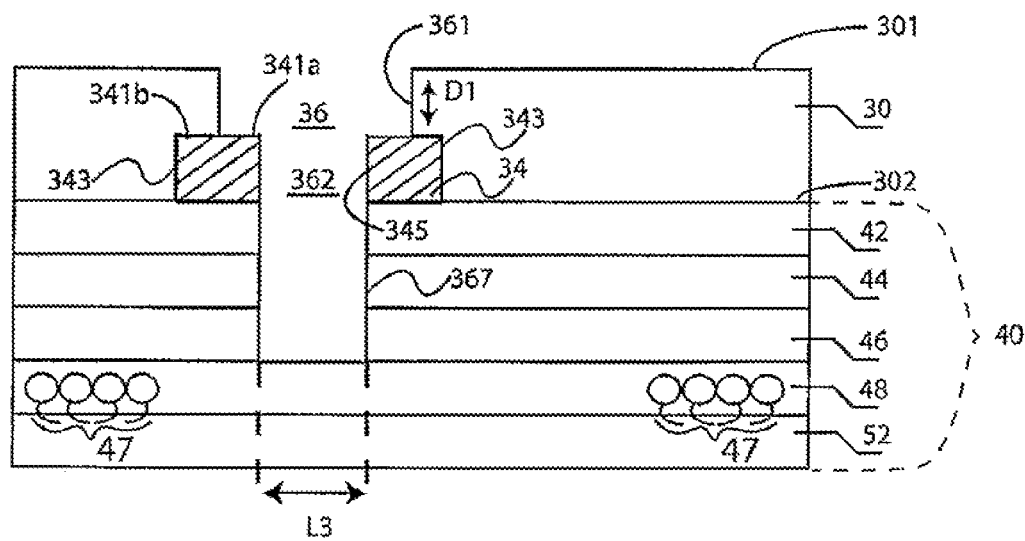
FIG. 3A is a simplified cross sectional diagram of a card being made as shown in step 5 of FIG. 2.
Figure 3B:
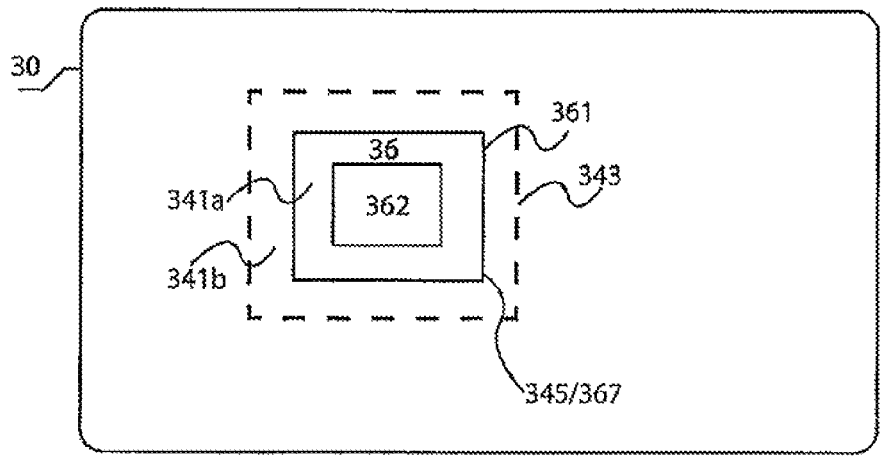
FIG. 3B is a top view of a card being formed as shown in FIG. 3A with a plug (34) and the opening (36) formed in the plug.

To appreciate the appearance of the card as finally formed reference is first made to FIG. 3A (which is essentially a copy of step 6 of FIG. 2) and to FIG. 3B. FIG. 3B is a top view of the card being formed showing the openings (36 and 362) formed in the metal and the plug. Note the hole 36 in metal layer 30 will have edge(s) 361 and the hole 362 in the plug and the underlying layers 42, 44, 46 will have edge(s) 345/367. The portion of the plug 34 below region 341b and the outer edge 343 of the plug will not be seen. Hence outer edge 343 is shown with dashed lines.

Figure 3C:
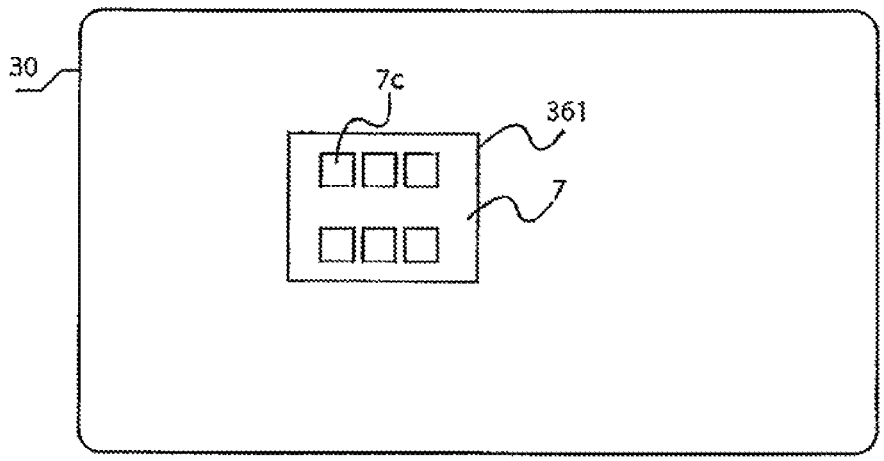
FIG. 3C is a top view of the top layer of a card embodying the invention formed in accordance with the process shown in FIG. 2.

The resultant FIG. 3C is a top view of a card 10 showing the module 7 mounted and inserted in the top of the card. The plug 34 is not seen since it is underneath the metal layer. Thus, the top surface of a card 10 formed in accordance with the process steps shown in FIG. 2 displays a completely smooth unbroken metal surface (except for the contact pad of the IC module). The underlying plug is covered (hidden) by an overlying metal region. Significantly, the card having the desired beautiful physical appearance can function as a wireless (contactless) card or as a contact card.

The dimensional tolerances of the various holes/openings and of the components need to be close enough so that on a platen lamination all parts fuse together with no airspace or sinks in the outward appearance of the card.

As shown in the Figures, metal layer 30 has a cut out 36 formed in its top surface. The thickness/depth D1 of cut out 36 is made substantially equal to the depth of the IC module 7. The hole/opening 36 is machined through metal layer 30 dimensioned to receive module 7, which is secured therein, as by bonding. Module 7 contains a microprocessor chip 7a (internally), a chip antenna 7b and a contact pad 7c. Pad 7c is a conventional contact pad used in contact-type smart cards and is positioned to engage contacts in a card reader when the smartcard is inserted therein.

By design, plug 34 is substantially wider than module 7. Preferably, plug 34 extends at least 0.04 laterally beyond either side of module 7. This prevents the metal in substrate 30 from interfering with communication between the card and chip. However, the plug does not have to be wider than module 7 (i.e., its lateral dimensions need not be greater than those of the module).

Module 7 is positioned vertically within metal layer 30 so as to provide a contact pad 7c along the top metal surface to realize the contact functions of the dual interface. Moreover, positioning module 7 on plug 34 which is made larger (though not necessarily so) in area than the module 7 makes it possible to decrease interference in the radio communication between module antenna 7b and the booster antenna 47.

Although preferred embodiments of the invention have been disclosed for illustrative purposes, those skilled in the art will appreciate that many additions, modifications, and substitutions are possible without departing from the scope and spirit of the invention.

Alternatively, cards embodying the invention may be formed as shown in FIGS. 4, 4A, 5A, 5B, 5C and 6. These cards differ from those discussed above in that a plug is formed whose thickness is equal to the thickness of the metal layer. That is, there is no recessed pocket.

Figure 4:
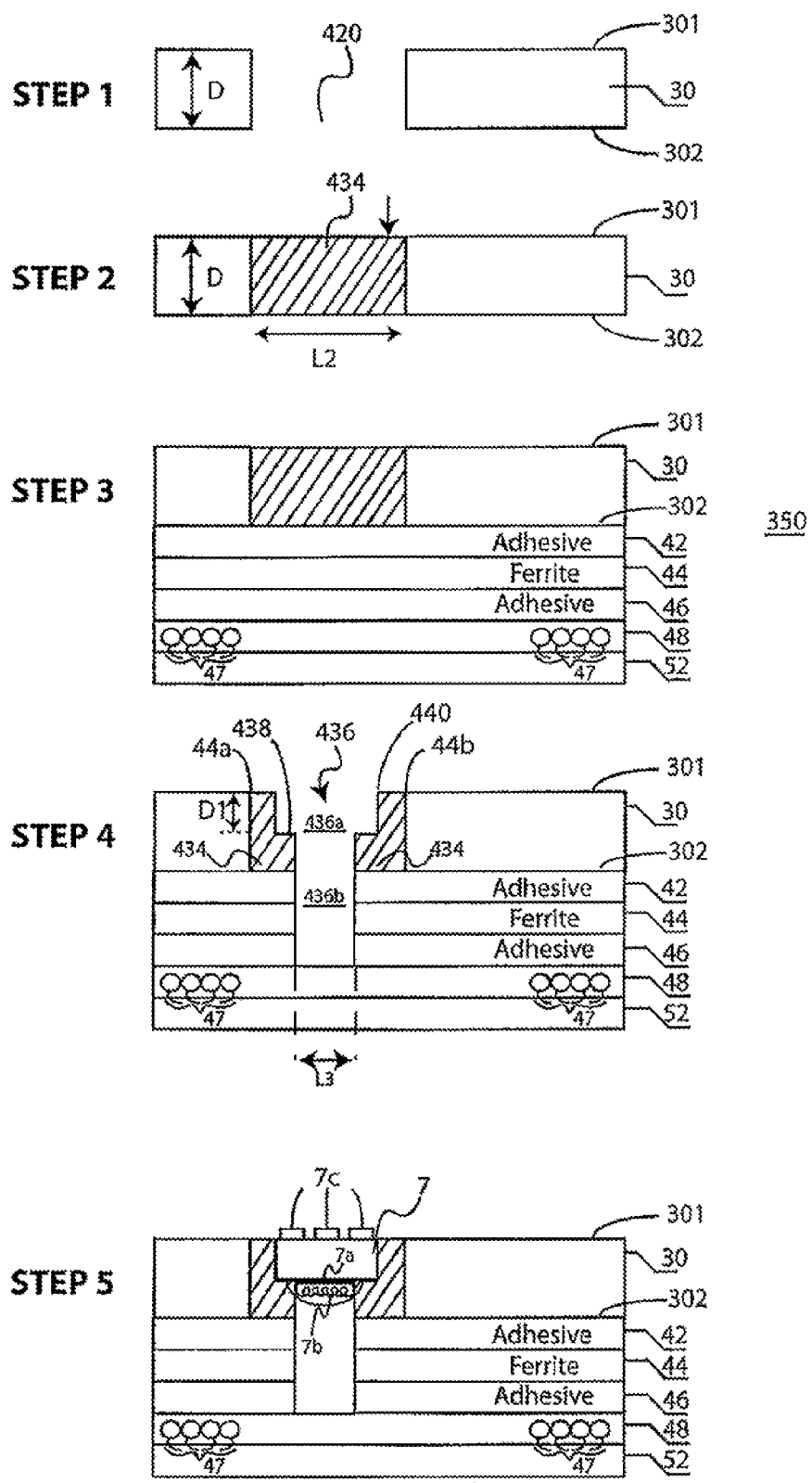
FIG. 4 includes cross sectional diagrams of various processing steps (1 through 5) to form a card according to another aspect of the invention.

As shown in FIG. 4, a card formed in accordance with this aspect of the invention may include the following processing steps and structure:

1—A metal layer 30 is selected (as shown in step 1 of FIG. 4) which is intended to serve as the top layer of a card 10. The metal layer 30 has a top (front) surface 301 and a bottom (back) surface 302 and a thickness (D) which may range from less than 0.01 inches to more than 0.02 inches. Metal layer 30 may have the same characteristics and properties as metal layer 30 shown and discussed above.

2—A hole 420 of depth D is formed in the metal layer 30 (as shown in step 1 of FIG. 4). The lateral dimensions of the hole are L2 and W2 (see FIGS. 5A and 5B). The hole 420 may be formed in any known manner (e.g., casting or milling). The hole 420 may be a regular or irregular solid cube, or a cylinder whose planar projection in the horizontal plane may be a square, a rectangle or a circle or an irregular shape. In the embodiment shown in FIG. 4, the lateral dimensions [length (L2) and width (W2)] of the hole 420 are respectively greater than the lateral dimensions [length L1 and width W1] of the IC module as further discussed below. Generally, L2 is greater than L1 (by at least 0.04 inches) and W2 is greater than W1 (by at least 0.04 inches). However, as noted above, L2 may be made equal to L1, and W2 may be made equal to W1. The advantage of making L2 and W2, respectively, larger than L1 and W1 is to provide greater separation between the metal layer and the IC module and thus enhance RF transmission and reception.

3—A plug 434 of any material like plug 34 which does not interfere with RF transmission is formed or shaped to conform to the dimensions of the hole 420 to fill the cut out region (as shown in step 2 of FIG. 4). Plug 434 is processed and functions to secure the IC module. The interior walls of the hole 420 and/or the exterior walls of the plug 434 is/are coated with a suitable adhesive so the plug 434 adheres firmly to the walls of the hole throughout the processing of the metal layer in the formation of the card. The plug 434 may be made of any thermoplastic material such as PET, PVC or other polymer or any material such as epoxy resins and a ceramic.

4—As shown in step 3 of FIG. 4, an adhesive layer 42 is used to attach a ferrite layer 44 to the back surface 302 of layer 30. An adhesive layer 46 is used to attach a plastic (e.g., PVC) layer 48 which contains and/or on which is mounted a booster antenna 47 to the ferrite layer. Layers 42, 44, 46, and 48 and the booster antenna 47 are formed in a similar manner as the corresponding number components shown in FIG. 2 and serve the same or similar functions.

5—The assembly comprising layers 30, 42, 44, 46 and 48 is laminated to form a card assembly 350 (as indicated in step 3 of FIG. 4).

6—A T-shaped hole/opening 436 is then formed through the plug 434. The hole 436 is formed by milling, drilling and/or any other suitable means. The top portion 436a of T-shaped hole 436 is formed to have lateral and depth dimensions to accommodate the IC module. Where the dimensions of IC module 7 are L1 by W1 by D1 the top portion of 436a will be formed to be just about L1 by W1 by D1 to enable the IC module to be snugly inserted within the hole 436a and to be glued in place. The bottom portion 436b of the hole 436 formed in plug 434, (by drilling vertically down about the center of the plug 434) extends through the underlying layers 42, 44 and 46 and until layer 48, as shown in step 4 of FIG. 4. The lateral dimensions of hole 436b formed in plug 434 are made large enough to enable sufficient RF signals to pass between booster antenna 47 and the IC chip module 7 to enable RF communication to take place reliably. The lateral dimensions of the hole 436b formed in the plug 434 are denoted as L3 and W3, where L3 and W3 are less than L1 and W1. Note that making L3 and W3 less than L1, and W1, respectively, results in the formation of ledges 438 which will provide support for the IC module and keep it at its designed height of D1 below the top card surface 301. The IC module 7 can be snugly inserted and attached (glued) to the ledges 438 and the top interior walls of the plug 434.

7—As shown in Step 5 of FIG. 4, IC module 7 which includes a chip 7a and a chip antenna 7b and a set of contacts 7c is positioned within hole 436a is glued in place.

Figure 5A:
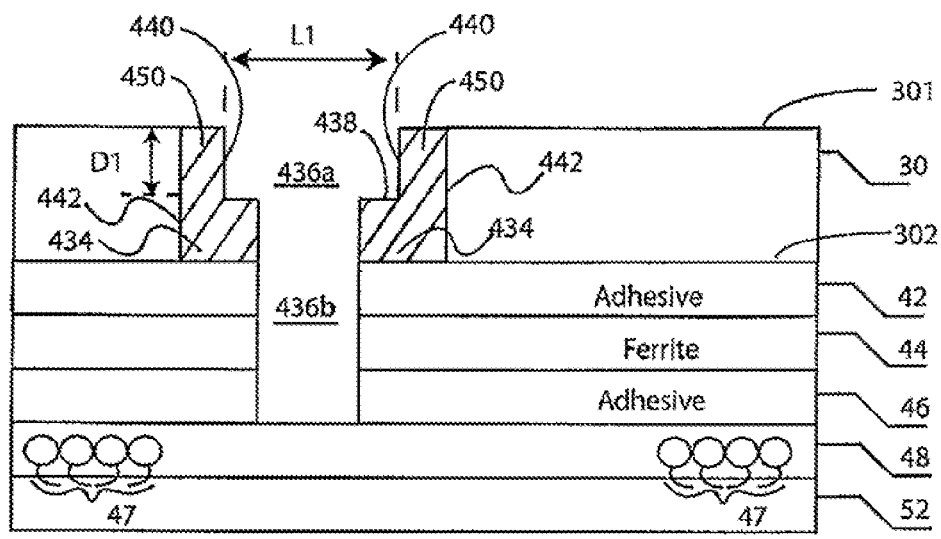
FIG. 5A is a cross sectional diagram corresponding to step 4 of FIG. 4 showing a plug and openings formed in the plug prior to insertion of an IC module.
Figure 5B:
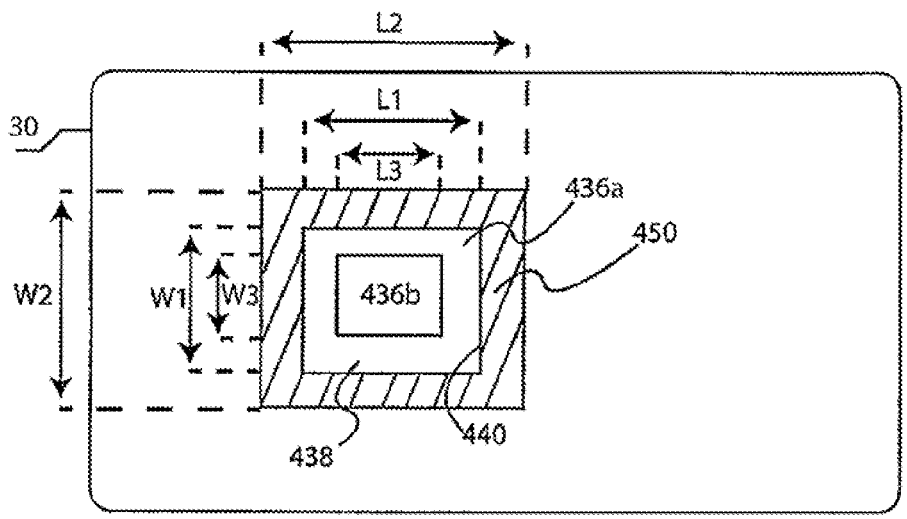
FIG. 5B is a top view of a card having the cross section shown in FIG. 5A showing the plug and openings formed in the plug prior to insertion of an IC module formed in accordance with FIG. 4.
Figure 5C:
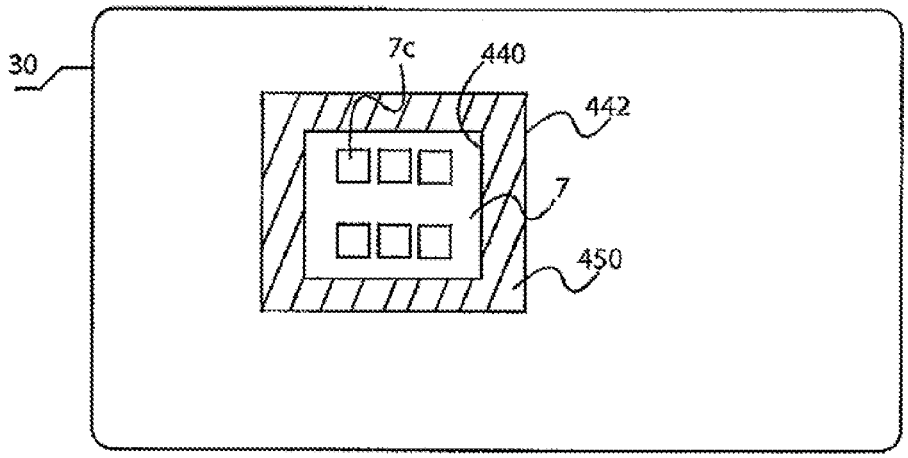
FIG. 5C is a top view of a card formed according to the process steps shown in FIG. 4 and as shown in FIGS. 5A and 5B with an IC module inserted in the opening for the module.
Figure 6:
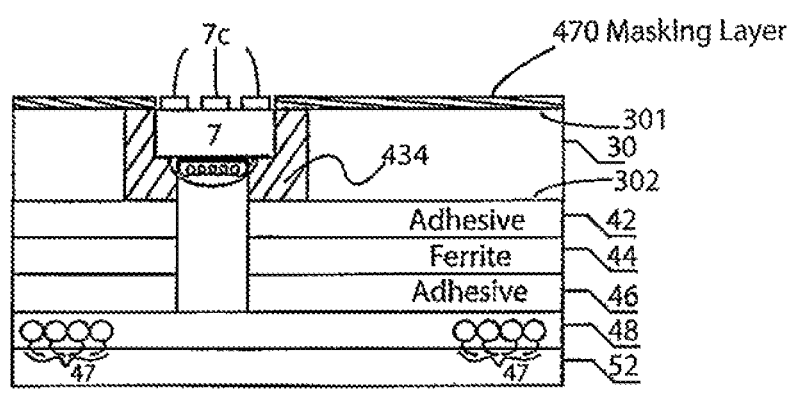
FIG. 6 is a cross-sectional diagram showing a masking layer formed on a card such as the one shown in FIG. 5C.

FIG. 5A is an enlarged cross sectional diagram corresponding to step 4 of FIG. 4. FIG. 5B is a top view of a card showing the holes formed in the metal and the plug. FIG. 5C is a top view of a card showing the module 7 mounted and inserted in the top of the card. The smart metal card 10 can function as a wireless (contactless) card or as a contact card. Note that as shown in FIGS. 5A, 5B and 5C the hole portion 436a has an inner edge 440. The plug has an outer edge 442. As is evident from FIGS. 5B and 5C, the IC module 7 will cover openings 436a and 436b. As a result there is a space/area 450 between edges 440 and 442 extending around the outer periphery of the IC module between the module 7 and the metal layer 30. The space/area 450 may be objected to on aesthetic grounds as it detracts from the continuous metal layer (except for the necessary module contact pad). However, it should be appreciated that the space area 450 may enhance RF transmission. The presence of space/area 450 and any depression or bump related to space 450 may be masked by the addition of a masking layer 470, as shown in FIG. 6. This may be acceptable in many instances. However, in instances where such a solution is still not acceptable or feasible, the solution is to revert to making cards as per the process steps shown in FIG. 2.

Thus, a problem with the smart cards formed in accordance with the process shown in FIG. 4 is that a portion of a plug may be seen. The portion of the plug may mar the continuous appearance of the card and/or as a bump on the surface or as a depression. This may be so, even if a masking (concealing) layer 470 is formed over layer 30.

As taught and discussed with reference to FIG. 2, above, the spacing and any discontinuity in the metal surface (except for the IC module) are avoided by forming a recess pocket 32 in substrate 30 and filling the recess with a plug 34 which is not seen from the top of the card. Thus, In contrast to previous and other dual interface smart metal cards, the plug 34 does not appear as a bump on the surface or as a depression. It is not visible when the card is viewed from the outside. The process of FIG. 2 thus differs from the process of FIG. 4 where a through hole 420 is formed in the metal layer 30 and a plug 434 is formed which fills the hole 420.

However, it should be noted that in all the embodiments shown herein a plug is used to separate an IC module from a surrounding metal layer to promote RF transmission capability and the plug is also used to position and secure the IC module within the card. Openings for the plug and its positioning within the card are designed to maintain the exterior of the card flat and visually pleasant.

What is claimed is:

1. A metal smart card with dual interface capability comprising:
    a metal layer of thickness D having a top surface and a bottom surface extending parallel to each other;
    an integrated circuit (IC) module having a top region with contacts enabling the IC module to make physical contact to a card reader and said IC module also including means for radio frequency (RF) communication with a card reader; said IC module having a length L1, a width W1 and a thickness of D1, which is less than D;
    a plug of non RF impeding material having lateral dimensions of L2, equal to or greater than L1, and W2 equal to or greater than W1;
    an opening in said metal layer extending for the full thickness of said metal layer in which is securely located said IC module mounted on said plug, said IC module and said plug extending in the vertical direction between the top and bottom surfaces of the metal layer, with the contacts of the IC module being positioned along the same horizontal plane as the top surface of the metal layer.

2. A metal smart card with dual interface capability as claimed in claim 1 further including a ferrite layer attached to the bottom surface of the metal layer and a vertical hole formed in the plug and through the ferrite layer for enhancing RF transmission with the IC module via said vertical hole.

3. A metal smart card with dual interface capability as claimed in claim 2 wherein the vertical hole has lateral dimension of L3 and W3, which lateral dimensions are less than the corresponding lateral dimensions, L1 and W1, of the IC module; and further including a booster antenna layer attached to the ferrite layer for enhancing RF transmission with the IC module via said vertical hole.

4. A metal smart card with dual interface capability as claimed in claim 3 wherein the lateral dimensions of the plug L2 and W2 are greater than the lateral dimensions L1 and W1 of the IC module.

5. A metal smart card with dual interface capability as claimed in claim 1 wherein the opening in the metal layer has a first region at and just below its the top surface for accommodating the IC module and a second region below the first region which extends until the bottom surface of the metal layer; in the first region the opening has the lateral dimensions of L1 and W1 for a depth of D1 and in the second region the opening has the lateral dimension of L2 and W2 for a depth of (D-D1) and wherein the IC module fits in and fills the opening in the first region and the plug fits in and fills the opening in the second region; and where L2 and W2 are respectively greater than L1 and W1.

6. A metal smart card with dual interface capability as claimed in claim 5, wherein a ferrite layer is attached to the bottom of the metal layer and a booster antenna layer is formed below the ferrite layer, and wherein a hole is formed in the ferrite layer to enhance RF transmission between the booster antenna layer and the IC module.

7. A metal smart card with dual interface capability as claimed in claim 1 wherein the opening in the metal layer has lateral dimensions of L2 and W2, where L2 and W2 are respectively greater than L1 and W1, and wherein the plug is attached to the metal layer and fills the opening within the metal layer, and wherein the plug has a first cut out region with lateral dimensions of L1 and D1 extending for a depth D1 below the top surface for accommodating the IC module and a second region below the first region which extends until the bottom surface of the metal layer for a depth of (D-D1); and wherein a hole is formed in the second region below the IC module having lateral dimension of L3 and W3, where L3 is less than L1 and W3 is less than W1.

8. A metal smart card with dual interface capability as claimed in claim 7 further including a masking layer formed over the top metal surface and any exposed plug portion.

9. A card comprising:
    a metal layer having a top surface and a bottom surfaces extending parallel to each other;
    a first region cut out in said top surface of said metal layer having a depth D1, a length L1 and a width W1;
    an integrated circuit (IC) module whose dimensions are substantially equal to D1, L1 and W1 is snugly and securely placed within the first cut out region; said IC module having contacts positioned along the top surface of the metal layer and including RF transmission means for enabling contact and contactless operation of the card;
    a second cut out region extending from said bottom surface of said metal layer until a distance D1 from the top surface, said second cut out region extending vertically below the first cut out region and generally in a symmetrical manner with respect to the first cut out region; said second cut out region having a length L2 greater than L1 and a width W2 greater than W1; and
    a plug formed of non RF impeding material designed to fit snugly within said second cut out region is securely attached thereto.

10. A card as claimed in claim 9, and said plug has a centrally located opening, said centrally located opening having lateral dimensions of length L3 which is smaller than L1 and width W3 which is less than W1; and wherein said card also includes a layer of ferrite material attached to the bottom side of the metal layer via an adhesive layer; and a booster antenna attached to the ferrite layer; and wherein the centrally located opening in the plug is extended vertically down through the ferrite layer to enhance RF communication.

11. A card as claimed in claim 10, wherein said card also includes a magnetic stripe, a signature panel and a hologram.

12. A card as claimed in claim 9, wherein said metal layer is one of stainless steel, iron, tantalum, aluminum, brass, copper, or any alloy and wherein said plug is made of any non-metallic substance or a metal such as tungsten which does not impede RF transmission.

13. A card as claimed in claim 9, wherein the dimensions of the length, width and thickness of the card are, respectively, in the range of 3.3 inches, 2.2 inches and 0.03 inches; wherein the thickness of the IC module may range from less than 0.005 inches to more than 0.02 inches; and wherein the length and width of the metal layer extends for the full length and width of the card and its thickness ranges from less than 0.01 inches to more than 0.02 inches.

14. A method of making a dual interface card which includes an integrated circuit (IC) module having contacts along its top surface and including RF transmission means for enabling contact and contactless operation of the card, and said IC module having a depth of D1, a length of L1 and a width of W1, the method comprising the steps of:
- selecting a metal layer having a top surface and a bottom surface extending parallel to each other and a depth D which is greater than D1;
- cutting out a plug region in said metal layer starting from said bottom surface of said metal layer for a distance D-D1 from the bottom surface of said metal layer, said plug region having lateral dimensions of length L2 equal to or greater than L1 and width W2 equal to or greater than W1;
- securely attaching a plug formed of non RF impeding material within said plug region, said plug designed to fit in and fill the plug cut out region;
- cutting out a module region in said top surface of said metal layer overlying said plug region; said module cut out region being disposed symmetrically with respect to the plug region; said module region having a depth D1 and a length L1 and a width W1;
- inserting and securely attaching said IC module within said module region with the contacts of the IC module positioned along the same horizontal plane as the top surface of the metal layer.

15. A method as claimed in claim 14 further attaching a ferrite layer to the bottom surface of the metal layer; and forming an opening in said plug and said ferrite layer, said opening having lateral dimensions of length L3 which is less than L1 and width W3 which is less than W1.

16. A method as claimed in claim 15 further including a layer including a booster antenna and attaching said booster antenna layer to the ferrite layer.

17. A method as claimed in claim 14 further attaching a ferrite layer to the bottom surface of the metal layer and a booster antenna layer to the ferrite layer and laminating the metal layer, the ferrite layer and the booster antenna layer.

18. A method as claimed in claim 14 further attaching a ferrite layer to the bottom surface of the metal layer and a booster antenna layer to the ferrite layer and a signature panel and magnetic stripe to the booster antenna layer.

19. A method as claimed in claim 14 wherein said metal layer is selected from stainless steel, iron, tantalum, aluminum, brass, copper, or any alloy; and wherein said plug is made of any non-metallic substance or a metal such as tungsten which does not impede RF transmission.

20. A method as claimed in claim 14 wherein L2 is greater than L1 and W2 is greater than W1.

21. A method of making a dual interface card which includes an integrated circuit (IC) module having contacts along its top surface and which includes RF transmission means for enabling contact and contactless operation of the card and said IC module having a depth of D1, a length of L1 and a width of W1, the method comprising the steps of:
- selecting a metal layer having a top surface and a bottom surface extending parallel to each other, and said metal layer having a depth D which is greater than D1;
- forming a plug region in said metal layer having lateral dimensions of length L2 equal to or greater than L1 and width W2 equal to or greater than W1 and extending vertically from the bottom surface a distance D-D1;
- securely attaching a plug formed of non RF impeding material within said plug region, said plug designed to fit in and fill the plug region;
- forming a module region extending within said metal layer overlying said plug region; said module region being disposed symmetrically with respect to the plug region; said module region having a depth D1 and a length L1 and a width W1; and
- inserting said IC module within said module region and securely attaching said IC module to said plug with the contacts of the IC module positioned along the same horizontal plane as the top surface of the metal layer.

22. A method as claimed in claim 21 wherein L2 is greater than L1 and W2 is greater than W1 and wherein said plug region has an additional region which extends the full depth of the metal layer around the IC module.

* * * * *